United States Patent
Ohashi et al.

[19]

[11] Patent Number: 6,113,705
[45] Date of Patent: Sep. 5, 2000

[54] HIGH-SPEED ROTATIONAL VAPOR DEPOSITION APPARATUS AND HIGH-SPEED ROTATIONAL VAPOR DEPOSITION THIN FILM METHOD

[75] Inventors: Tadashi Ohashi, Sagamihara; Katuhiro Chaki, Hadano; Ping Xin, Sagamihara; Tatsuo Fujii, Tokuyama; Katsuyuki Iwata, Kudamatu; Shinichi Mitani, Numazu; Takaaki Honda, Mishima; Yuusuke Sato, Tokyo, all of Japan

[73] Assignees: Toshiba Ceramics Co., Ltd.; Toshiba Kikai Kabushikikaisha, both of Tokyo, Japan

[21] Appl. No.: 09/137,298

[22] Filed: Aug. 20, 1998

[30] Foreign Application Priority Data

Aug. 21, 1997 [JP] Japan .................................. 9-240331

[51] Int. Cl.[7] .................................................. C23C 16/00
[52] U.S. Cl. .......................................... 118/730; 118/715
[58] Field of Search ..................... 118/715, 730

[56] References Cited

U.S. PATENT DOCUMENTS 5,264,040  11/1993  Geyling ................................... 118/728
5,792,272   8/1998  van Os et al. ...................... 118/723 IR

OTHER PUBLICATIONS

Design and Applications of Large Area RDRs, G.S. Tompa et al, Emcore Research Laboratories, III–Vs Review, vol. 7 No. 3.

Patent Abstract of Japan, Sato Hirosuke, Vapor Growth Device, Pub. No. 5–74710, Pub. Date Mar. 36, 1993.

Patent Abstract of Japan, Toishimitsu et al., Vapor Growth Method, Pub. No. 5–90167, Pub. Date Apr. 9, 1993.

Patent Abstract of Japan, Keichi et al., Vapor Growth Device, Pub. No. 6–216045, Pub. Date Aug. 5, 1994.

Patent Abstract of Japan, Sato Hirosuke, Vapor Growth Equipment, Pub. No. 7–50260, Pub. Date Feb. 21, 1995.

*Primary Examiner*—Paul Thibodeau
*Assistant Examiner*—Monique R. Jackson
*Attorney, Agent, or Firm*—Foley & Lardner

[57] ABSTRACT

There is provided a vapor deposition apparatus for forming a thin film which includes plural reaction gas supply ports at the top portion of a hollow reactor, an exhaust port at the bottom of the reactor, a rotational substrate holder provided inside the reactor on which a wafer substrate is mounted. A straightening vane having plural gas holes formed therein is provided on an upper portion of the reactor. The reactor is partitioned into upper and lower portions which have different inside diameters, with the inner diameter of the upper portion being smaller than the inner diameter of lower portion. The lower end of the upper portion and the upper end of the lower portion are linked by a linking portion which has a predetermined shape to make continuous the hollow inside of the reactor. A thin film is formed on the surface of a wafer substrate, which is placed on the rotational substrate holder, by supplying a reaction gas into the reactor.

6 Claims, 6 Drawing Sheets

HIGH-SPEED ROTATIONAL VAPOR DEPOSITION APPARATUS AND HIGH-SPEED ROTATIONAL VAPOR DEPOSITION THIN FILM METHOD

BACKGROUND OF THE INVENTION

1. Field of the Invention

The present invention relates to a high-speed rotational vapor deposition apparatus and a high-speed rotational vapor deposition thin film forming method using the same, and particularly to a high-speed rotational vapor deposition apparatus which is applied to CVD and epitaxial processes in a manufacturing process of semiconductor wafers to which high quality is required, and in which reaction gas flow is uniformly controlled to suppress occurrence of contaminants, and a high-speed rotational vapor deposition thin film forming method for forming thin films having uniform thickness, uniform in-plane characteristics and little crystal defect through the CVD process, the epitaxial process, etc. by using the high-speed vapor deposition apparatus.

2. Description of the Related Art

FIG. 5 is a schematic diagram showing a conventional vapor deposition apparatus for forming thin films. In FIG. 5, a rotational substrate holder 52 for mounting a wafer substrate 51 such as a silicon wafer or the like, a rotational shaft 53 for rotating the rotational substrate holder 52 and a heater 54 for heating are generally disposed at the lower portion in a cylindrical reactor 50, and a rotating motor (not shown) is connected to the rotational shaft 53. A rotational mechanism containing the rotational substrate holder, etc. as described above is surrounded and protected by a partition plate 58.

Further, plural exhaust ports 55 for exhausting non-reacted gas, etc. are disposed et the bottom portion of the reactor 50 and connected to an exhaust control device (not shown).

Plural gas supply pipes 56 for supplying raw-material gas and carrier gas into the reactor and a disc-shaped straightening vane 57 are provided at the top portion of the reactor 50. The straightening vane 57 is perforated with many holes 57a for regulating flow of gas.

The conventional vapor deposition apparatus is constructed as described above, and the substrate 51 mounted on the rotational substrate holder 52 which is rotated at a predetermined rotational number by the rotation of the motor is heated to a predetermined temperature by the heater 54 while the substrate 51 is rotated. At the same time, reaction gas such as raw-material gas, carrier gas, etc. are introduced through the plural gas supply pipes 56 into tile reactor 50, made uniform in the momentum of the gas and the pressure distribution, and then passed through the many holes 57a of the straightening vane 57 so that the gas flow-rate distribution in the reactor is uniform, whereby the reaction gas is uniformly supplied onto the wafer substrate 51 on the rotational substrate holder 52 to grow a thin film in vapor phase.

In the vapor deposition apparatus for forming a thin film on a semiconductor wafer as described above, various proposals have been made to prevent occurrence of particles and adhesion of deposits to the inner wall of the reactor due to the thin film forming gas, and also to prevent occurrence of crystal defects due to some troubles in a thin film forming process to thereby obtain a wafer having a thin film which is homogenous and uniform in film thickness.

For example, in Japanese Laid-open Patent Application No. Hei-5-74719, the supply flow amount of the raw-material gas is controlled to a predetermined value to prevent the temperature variation in the reactor, thereby suppressing occurrence of crystal defects.

In Japanese Laid-open Patent Application No. Hei-5-90167, the raw-material gas amount, the pressure in the reactor, the rotational number of the rotational substrate holder, etc. are controlled to predetermined values so that the in-plane temperature distribution of the wafer substrate in the thin film forming process is made uniform, thereby preventing slip.

In Japanese Laid-open Patent Application No. Hei-6-216045, a part of the inner wall of the reactor in which deposits are liable to occur is provided with a shielding pipe while the inner peripheral surface thereof is kept smoothened, thereby facilitating a cleaning work of the reactor after the thin film forming operation is performed, and also the gas flow is kept to a laminar flow state to form a homogenous thin film.

Further, in Japanese Laid-open Patent Application No. Hei-7-50260, a method of introducing the raw-material gas and the carrier gas into the reactor is set to a predetermined one to thereby make uniform the gas momentum and the gas pressure, whereby the raw-material gas, etc. are supplied onto the substrate at a uniform flow rate to make the film thickness uniform.

However, the various proposed conventional vapor deposition apparatuses as described above have not yet been capable of sufficiently preventing troubles such as the occurrence of the crystal defect, the adhesion of particles on a wafer substrate on which a thin film is formed, etc. Further, particularly, following recent ultra-high integration of semiconductors, higher quality has been increasingly required to wafer substrates, and reduction in quality due to a slight defect on a thin-film formed wafer substrate induces a critical problem in many cases.

SUMMARY OF THE INVENTION

In view of the problem in reduction in quality of a wafer substrate on which a thin film is formed by vapor deposition according to the conventional vapor deposition apparatus as described above, the present invention has been implemented to solve the above problem. First, the inventors of this applicant have made detailed considerations on the phenomena occurring in the conventional vapor deposition apparatuses. As a result, the inventors have observed such a phenomena that lots of particles adhere to the wall of the reactor, and found out that this phenomenon shortens the maintenance cycle, and the particles adhering to the wall of the reactor also adhere to a wafer substrate to cause crystal defects or directly cause the reduction in quality of the wafer substrate.

From the above knowledge, in order to further find out the cause of the phenomenon that lots of particles adhere to the wall of the reactor, the inventors have also made considerations on the flow of raw-material gas in the reactor, etc. As a result, it has been found out that the following phenomenon occurs in the reactor.

That is, (a) in the conventional reactor, reaction gas such as silicon raw-material gas, etc. which are introduced from the top portion of the reactor and supplied onto a wafer substrate 51 at a uniform flow rate, reaches the vicinity of the wafer substrate 51 at the lower portion of the reactor 50 which is heated to a higher temperature than that of the upper portion thereof by a heater 54, and heated therein. As a result, as indicated by an arrow of FIG. 5, an upwardly-moving stream of the reaction gas occurs to induce a blow-up phenomenon of the reaction gas along the wall of the reactor, so that an eddy flow of gas occurs.

(b) Since the heated reaction gas flows upwardly, the temperature of the overall area in the reactor 50 is also increased to promote uniform nucleus formation of thin-film forming raw-material gas in vapor phase, so that occurrence of particles is promoted in vapor phase.

(c) Further, when the gas eddy flow occurs, dopant in the reaction gas may be re-doped at the outer periphery portion of the wafer substrate 51 on the rotational substrate holder 52, resulting in ununiformity of the in-plane resistance value distribution of the wafer substrate thus obtained.

(d) Still further, aside from the occurrence of tile gas eddy flow, the blow-up phenomenon in which the reaction gas flowing down to the vicinity of the wafer substrate upwardly moves in the reactor produces so-called "disturbance of gas" in which the gas flow becomes complicated at the outer periphery side of the rotational substrate holder 52. The disturbance of the gas flow promotes reaction of non-reacted gas which should be exhausted from an exhaust port 55, so that thin film components are deposited on the outer periphery surface of the rotational substrate holder 52, and particles adhere to the wall of the reactor which confronts the outer peripheral surface of the rotational substrate holder 52.

Since the gas flow state in the reactor is an important factor to form a uniform vapor deposition thin film, the occurrence phenomenon of the gas eddy flow has been considered in more detail.

That is, it has been found out that eddy flow occurs at the upper portion of the outside of the rotational substrate holder 52 as shown in comparative examples described later.

In this case, if the gas flow rate in the shaft direction of the rotational substrate holder is set to an extremely high rate of about 1m/s or more to increase the gas flow amount, the gas flow is made laminar flow, and occurrence of gas eddy flow or gas flow disturbance which induces the above various troubles can be suppressed to some extent. However, in order to satisfy the above condition, a large amount of carrier gas must be made to flow, and the vapor deposition apparatus must be designed in a large size and the cost of facilities is increased, resulting in increase of running cost.

Further, the occurrence of the gas eddy flow and the gas flow disturbance can be suppressed by reducing the gas pressure at the exhaust portion. That is, according to the rule of the ideal gas, the pressure and volume of gas are varied in inverse proportion to each other. Therefore, if the pressure in the reactor is reduced, the same effect as increase of volume can be obtained, and thus the flow rate (linear velocity) at the gas inlet port is increased. According to the kinematic rule of hydrodynamics in the case where the effect of the pressure on the viscosity of the gas flow can be neglected, the effect of reduction in pressure is the same as increase of flow amount.

In the pressure range which is actually used in an epitaxial process, that is, in the range of 10 to 200 Torr, variation of viscosity is considered to be small, so that the gas flow state of 40 Torr internal pressure of the reactor and 200 liter/minute are the same as the gas flow state of 20 Torr internal pressure of the reactor and 100 liter/minute. However, in this case, the control of the gas pressure at the low-pressure portion is difficult.

Further, it has been attempted that occurrence of gas eddy flow is prevented by narrowing the upper portion of the reactor so that the diameter of the upper portion is smaller than that of the lower portion in order to suppress occurrence of the gas eddy flow, thereby blocking the space in which the high-temperature reaction gas flows upwardly. However, in this case, adhesion of particles at the upper portion of the reactor, etc. can be prevented, however, it has been found that gas eddy flow and disturbance of gas flow occur at a large-diameter portion of the reactor located at the outside of the rotational substrate holder as indicated by an arrow in FIG. 8 schematically showing a vapor deposition apparatus used in a comparative example described later in which the diameter of tire upper portion of the reactor is merely set to a small value.

Further, it has been also found out that when the gas eddy flow or the disturbance of gas flow occurs at the portion at which the diameter of the reactor is increased, the trouble-occurring area of the reactor in which particles adhere to the peripheral wall of the lower portion of the reactor or thin film forming components deposit due to the reaction of non-reacted gas is merely shifted and thus the same disadvantages of shortening of the maintenance cycle, etc. also occur.

On the basis of the above knowledge, the inventors have found that the disadvantages such as tile reduction in quality of the thin film formed wafer substrate, the shortening of the maintenance cycle of the reactor, etc. are caused by the gas flow disturbance of upward flow of gas in the reactor, and that the adhesion of a lot of particles to the wall of the reactor and the peripheral surface of the lower portion of the rotational substrate holder, the deposition of the thin film forming components and the doping of dopant into the outer peripheral portion of the wafer can be prevented by not only omitting or blocking the space portion of the upper portion in which the above gas-flow troubles occur, but also providing a curved-surface link portion at a predetermined position between the upper and lower portions of the reactor which are different in diameter, and also by setting the ratio of the diameter of the upper portion, the diameter of the lower portion and the diameter of the rotational substrate holder to a predetermined value, whereby the reduction in quality of the wafer substrates can be prevented, and have implemented the present invention.

That is, an object of the present invention is to provide a vapor deposition apparatus which can prevent adhesion of particles occurring due to uniform nucleus formation of silicon raw-material gas to the peripheral wall of a reactor, and also prevent deposition of thin film forming components to the outer peripheral portion of a rotational substrate holder and the peripheral wall of the reactor.

Another object of the present invention is to provide a vapor deposition thin film forming method which can form a uniform thin film having little crystal defect and high quality on a wafer substrate by vapor deposition.

According to a first aspect of the present invention, a vapor deposition apparatus for forming a thin film, which includes plural reaction gas supply ports at the top portion of a hollow reactor, an exhaust port at the bottom portion of the reactor, a rotational substrate holder which is provided inside the reactor and on which a wafer substrate is mounted, and a straightening vane having plural gas holes formed at the upper portion of the inside thereof, thereby forming a thin film on the surface of a wafer substrate on the rotational substrate holder by supplying the reaction gas into the reactor, is characterized in that the hollow inside of the reactor is partitioned into cylindrical upper and lower portion which have the same center axis and are different in equivalent inner diameter therebetween, the equivalent inner diameter of the upper portion being smaller than that of the lower portion, and the lower end of the upper portion and the upper end of the lower portion being linked to each other by a link portion to make continuous the hollow insides of the upper and lower portions of the reactor, and that the lower end of the link portion (the upper end of the lower portion) is disposed so as to be spaced from the surface of the wafer substrate mounted on the rotational substrate holder by a predetermined height difference.

In the above-described vapor deposition apparatus of the present invention, it is preferable that the horizontally sectional shape of the hollow inside of the reactor is circular and the rotational substrate holder has an outer diameter ($D_s$) and is circular, the inner diameter ($D_1$) of the upper portion of the reactor being set to 90 to 110% of the outer diameter ($D_s$), and the inner diameter ($D_2$) of the Lower portion of the reactor being set to 125% or more of the outer diameter ($D_s$), and also it is preferable that the link portion is designed so that the following condition A is satisfied and the height difference between the upper end of the lower portion of the reactor and the surface of the wafer substrate mounted on the rotational substrate holder is within 4% of the outer diameter ($D_s$).

The condition A is defined as follows. When W represents the half of the difference between the inner diameter ($D_1$) of the upper portion and the inner diameter ($D_2$) of the lower portion on a section which is taken by a plane passing the center axis of the cylindrical portions of the upper and lower portions of the reactor, on any section, (1) the lower end of the upper portion is located at the upper side of the upper end of the lower portion by a height difference from ½W to W, and (2) the link portion substantially exists in an area (an area indicated by oblique lines in FIG. 10) surrounded by a first line segment connecting the lower end of the upper portion and the upper end of the lower portion, a second line segment extending from the upper end of the lower portion to the inside of the reactor perpendicularly to the center axis by ½W, a quarter circular arc which is connected to the second segment at one end thereof, directs to the lower end of the upper portion and has a radius of curvature of ½W, and a third line segment extending from the other end of the circular arc to the lower end of the upper portion, and the link portion is designed substantially in a convex shape which projects to the inside of the reactor.

According to a second aspect of the present invention, there is provided a high-speed rotational vapor deposition thin film forming method characterized in that in the high-speed rotational vapor deposition apparatus, the rotational speed of the rotational substrate holder is set to 500 rpm or more, and reaction gas containing thin film forming raw-material gas and carrier gas is supplied from the plural reaction gas supply ports and passed through the holes of the straightening vane to flow onto the wafer substrate.

According to the vapor deposition apparatus thus formed, the occurrence of the gas eddy flow due to the blow-up phenomenon of reaction gas which occurs along the wall of the reactor in the conventional vapor deposition apparatus can be suppressed by changing the shape of the reactor so that the diameter of the upper portion is smaller than that of the lower portion, thereby removing the gas eddy occurrence space, and at the same time increase of vapor temperature at the upper portion of the reactor can be prevented, so that the uniform nucleus formation of the thin film forming raw-material gas such as silicon, etc. can be suppressed, and occurrence of particles in vapor phase can be suppressed.

Therefore, the shortening of the maintenance cycle due to adhesion of particles to the wall of the reactor, the occurrence of crystal defects due to adhesion of particles to the wafer and the reduction of quality of the wafer can be prevented.

Further, the gas flow just above the wafer mounted on the rotational substrate holder uniformly flows from the center of the wafer to the outer peripheral portion in parallel to the wafer surface without being disturbed, whereby suppression of occurrence of gas eddy flow can be achieved.

Therefore, re-doping of dopant into vapor phase at the outer peripheral portion of the substrate can be prevented, and a thin film formed wafer substrate having a uniform in-plane resistance value distribution and high quality can be obtained.

Further, since the upper portion of the reactor is narrowed, the gas flow rate in the shaft direction of the rotational substrate holder can be increased without a relatively small amount of carrier gas amount, and the carrier gas amount can be reduced to be less as compared with the conventional apparatus.

Further, the lower end of the small-diameter upper portion of the reactor and the upper end of the large-diameter lower portion of the reactor are connected to each other through the link portion which is designed so as to satisfy a predetermined condition. Therefore, the gas flow can be smoothened, and the diameter of the reactor is gradually increased, so that the gas flow which occurs on the rotational substrate holder and directs from the center to the outer periphery is straightened, thereby suppressing so-called gas flow disturbance which occurs at the diameter-increased lower portion at the peripheral side of the rotational substrate holder due to the design in which the diameter of the upper portion of the reactor is smaller than that of the lower portion. Accordingly, the adhesion of particles to the inner wall of the diameter-increased link portion and the lower portion of the reactor and the deposition of the thin film forming components can be prevented.

Further, the ration of the diameter of the upper portion of the reactor, the diameter of the lower portion of the reactor and the diameter of the rotational substrate holder are set to a predetermined value, whereby the upward flow of the gas in the reactor can be prevented and the occurrence of particles can be reduced. In addition, the occurrence of the gas eddy flow and the gas flow disturbance can be prevented. Further, the particles adhering to the wall of the reactor can be avoided from falling down onto the wafer substrate on the rotational substrate holder.

Still further, the surface of the wafer substrate on the rotational substrate holder and the lower end of the link portion (the upper end of the lower portion of the reactor) are set to have a predetermined height difference which corresponds to a predetermined rate to tile outer diameter of the rotational substrate holder. Therefore, the towel end of the upper portion does not disturb the smooth gas flow to prevent tile upward flow of the gas, and the occurrence of the gas eddy flow and the disturbance of the gas flow can be prevented.

Therefore, the thin film formed wafer substrate having no crystal defect and high quality can be obtained.

Further, the high-speed rotational vapor deposition thin film forming method uses the above apparatus, and particularly the rotational speed of the rotational substrate holder is controlled so that the reaction gas flow can be supplied onto the rotational substrate holder so as to uniformly flow as laminar flow, so that the high-quality thin film having no crystal defect can be formed on the wafer substrate by vapor deposition.

DETAILED DESCRIPTION OF THE PREFERRED EMBODIMENTS

A preferred embodiment according to the present invention will be described with reference to the accompanying drawings.

The present invention is not limited to the following embodiment.

Figure 1:
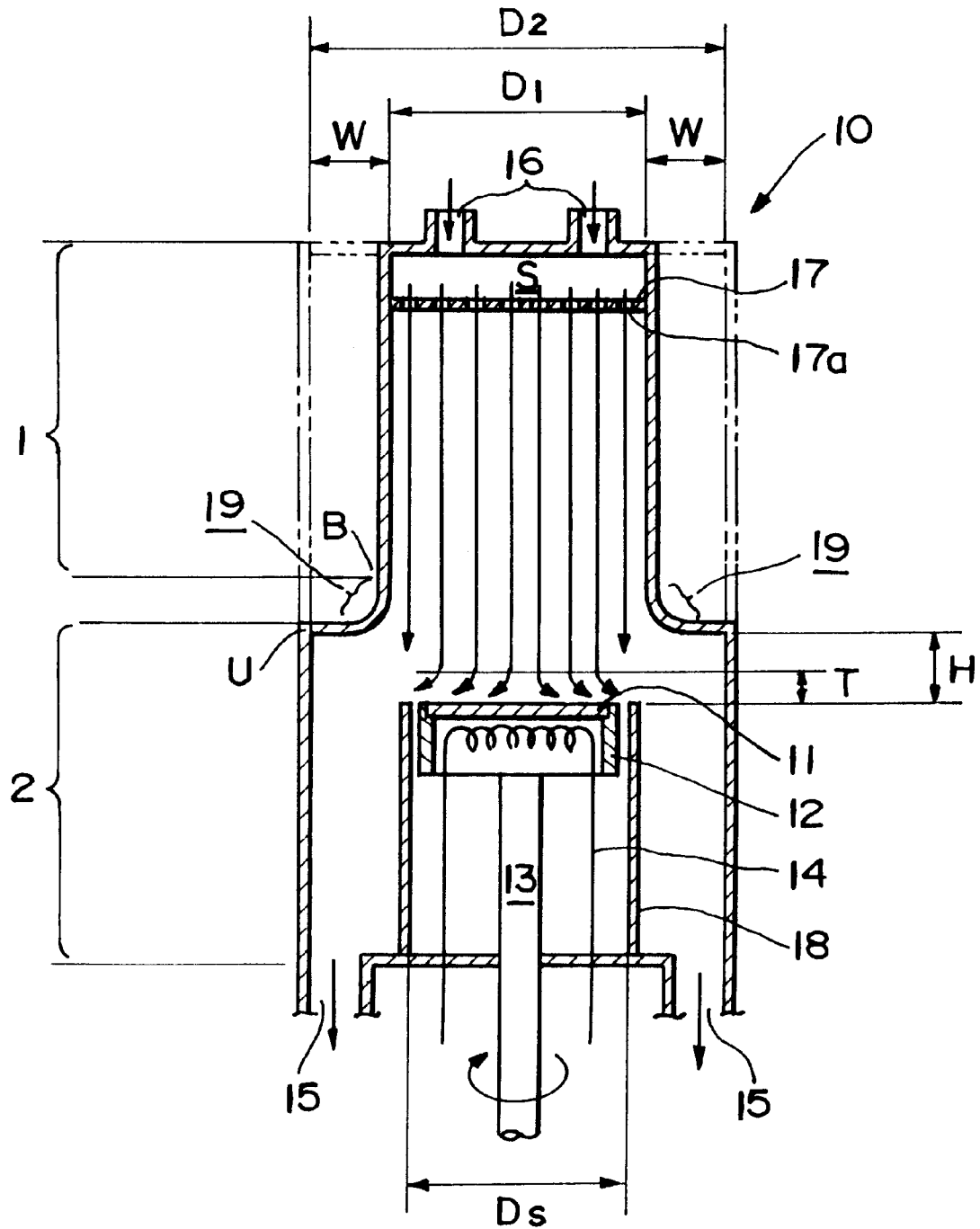
FIG. 1 is a longitudinally sectional view showing a reactor structure of a high-speed rotational vapor deposition apparatus according to the present invention.

FIG. 1 is a longitudinally sectional view showing an embodiment of a vapor deposition apparatus according to the present invention.

In FIG. 1, a reactor 10 is partitioned into a cylindrical portion 1 and a cylindrical lower portion 2 which have the same center axis, the diameter of the upper portion 1 being set to be smaller than that of the lower portion 2. That is, the inner diameter $D_1$ of the upper portion is smaller than the inner diameter $D_2$ of the lower portion ($D_1 < D_2$).

Further, an upper end portion U of the large-diameter lower portion 2 and a lower end portion B of the small-diameter upper portion 1 are linked to each other by a link portion 19, whereby the inside hollow space of the reactor is made continuous although the upper and lower portions are different in diameter.

In this case, the small-diameter upper portion 1 and the link portion 19 may be mounted as a liner wall in the hollow inside of a reactor which is designed in the same structure as the conventional reactor having the upper and lower portions having the same diameter as indicated by a two-dotted chain line (imaginary line) of FIG. 1.

Further, the side wall surface of the upper portion 1 of the reactor is normally parallel to the side wall surface of the lower portion 2 and formed vertically, so that it is perpendicular to the upper surface of the rotational substrate holder. The link portion 19 between the lower end B of the upper portion and the upper end U of the lower portion is formed in a convex shape, whereby the gas flow in the inner peripheral surface area of the upper portion 1 of the reactor is smoothly guided to the inner peripheral surface area of the lower portion 2.

In FIG. 1, a rotational substrate holder 12 for mounting a wafer substrate 11 thereon is freely rotatably supported in the lower portion 2 of the reactor by a rotational shaft 13, and a heater 14 for heating the rotator 12 and the wafer substrate 11 mounted thereon is disposed below the rotator 12. The rotational substrate holder 12 is disposed at the lower side so that the wafer substrate 11 mounted on the upper surface of the rotational substrate holder 12 and the lower end of the link portion 19 are disposed to keep a predetermined height difference (H) therebetween. The rotational shaft 13 is connected to a rotating motor (not shown), and the periphery of the rotational mechanism constructed by the above elements is surrounded by a partition plate 18, and protected from the reaction gas, etc.

Further, plural exhaust ports 15 for exhausting non-reacted gas, etc. are disposed at the bottom portion of the reactor 10.

At the upper portion 1 of the reactor are disposed plural gas supply ports 16 for supplying reaction gas containing raw-material gas such as silane ($SiH_4$), dichlorosilane ($SiH_2Cl_2$) or the like and carrier gas such as hydrogen ($H_2$), argon (Ar), helium (He) or the like.

It is preferable that the small diameter $D_1$ of the upper portion 1 of the reactor, the large-diameter $D_2$ of the lower portion 2 and the diameter $D_s$ of the rotational substrate holder 12 have the following relationship):

(1) $D_1$ is larger than the diameter of the wafer substrate 11, mounted on the rotational substrate holder 12.

If $D_1$ is smaller than the diameter of the wafer, particles falling down from the inner wall surface of the upper portion 1 of the reactor easily adhere to the wafer substrate, so that the number of crystal defects measured as LPD (laser scatterer on wafer surface (containing particles)) is increased.

Further, it is difficult to perform a contactless temperature measurement based on infrared rays on the outer peripheral portion of the wafer substrate which is normally carried out in the vapor deposition thin film forming process.

(2) It is preferable that $D_1$ is equal to $0.9D_s$ to $1.1D_s$ ($D_1/D_s$ is equal to 0.9 to 1.1), and $D_2 \geq 1.25D_s$ ($D_2/D_s$ is equal to 1.25 or more).

If $D_1/D_s$ is less than 0.9, the wall surface of the upper portion is excessively proximate to the wafer substrate 11 mounted on the rotational substrate holder 12, and the particles falling down from the inner wall surface of the reactor are liable to adhere to the wafer substrate although it is dependent on the height difference H of the link portion. Therefore, as in the case where $D_1$ is smaller than the diameter of the wafer substrate, the number of crystal defects measured as LPD is increased, and the quality of the thin film formed wafer substrate is reduced.

On the other hand, if $D_1/D_s$ is larger than 1.1, the blow-up phenomenon of the gas flow along the inner wall of the reactor occurs, and also gas eddy flow occurs.

On the other hand, if $D_2/D_s$ is less than 1.25, the gas flow disturbance at the outside of the rotational substrate holder 12 cannot be suppressed. Therefore, the particles adhere to the inner wall of the reactor which confronts the outside of the rotational substrate holder 12, or the non-reacted gas gets into the lower side of the rotational substrate holder 12 and reacts at that place, so that the thin film forming components deposit on the inner wall of the lower portion 2 of the reactor.

(3) $D_2/D_1$ is above 1.2 ($D_2/D_1 \geq 1.2$) and above the half of the difference in diameter between the upper and lower portions of the reactor (($D_2-D_1$)/2), that is, the interval distance W between the inner peripheral wall of the lower portion 2 and the inner peripheral wall of the upper portion 1 is above $0.1D_1$. If $D_2/D_1$ is less than 1.2, that is, W is less than 0.1D, the blow-up phenomenon of the gas flow along the wall of the reactor occurs, and thus the gas eddy flow occurs, so that the effect of preventing the blow-up phenomenon by reducing the diameter of the upper portion of the reactor to suppress the occurrence of the gas eddy flow is reduced.

When W represents the half of the difference between the inner diameter ($D_1$) of the upper portion and the inner diameter ($D_2$) of the lower portion on a section which is taken by a plane passing through the center axis of the cylinder portions of the upper and lower portions of the reactor, the link portion 19 of the reactor is disposed so that the lower end B of the upper portion is located above the upper end U of the lower portion by the distance range of ½W to W in any section.

If this distance is smaller than ½W, the gas flow discharged from the upper side of the rotational substrate holder 12 is disturbed due to the relationship with H as described later, resulting in occurrence of turbulent flow (eddy flow).

On the other hand, if this distance is larger than W, the distance between the link portion and the outer peripheral portion of the holder 12 is relatively larger, and thus a low-pressure area is formed just below the link portion, so that counter flow to the gas flow discharged from the holder 12 occurs to induce turbulent flow (eddy flow).

In the present invention, the lower end of the upper portion corresponds to the portion at which the cylindrical portion of the upper portion is terminated, that is, the portion just before the increase of the diameter by the link portion is started. However, when the diameter increasing rate is less than about 10% (the increment of diameter/height) (i.e., it is regarded as being substantially cylinder), this portion is contained in the lower end of the upper portion. Likewise, the upper portion of the lower portion of the reactor contains a portion at which the diameter reducing rate is less than about 10%.

Figure 10:
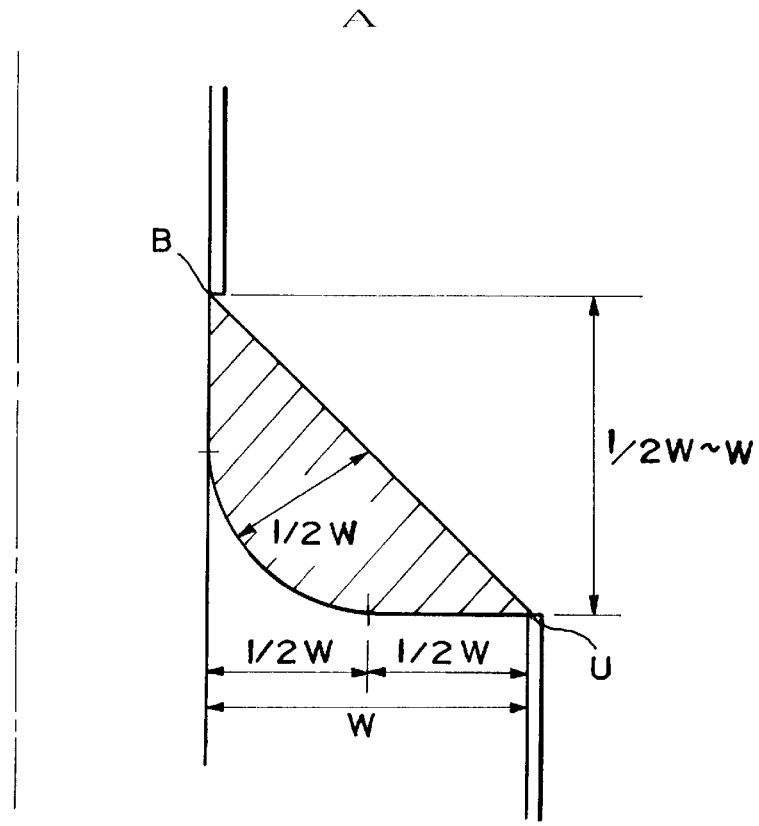
FIG. 10 is a longitudinally sectional view showing the structure of a link portion according to the present invention, and an area where the link portion exists.
Figure 10:
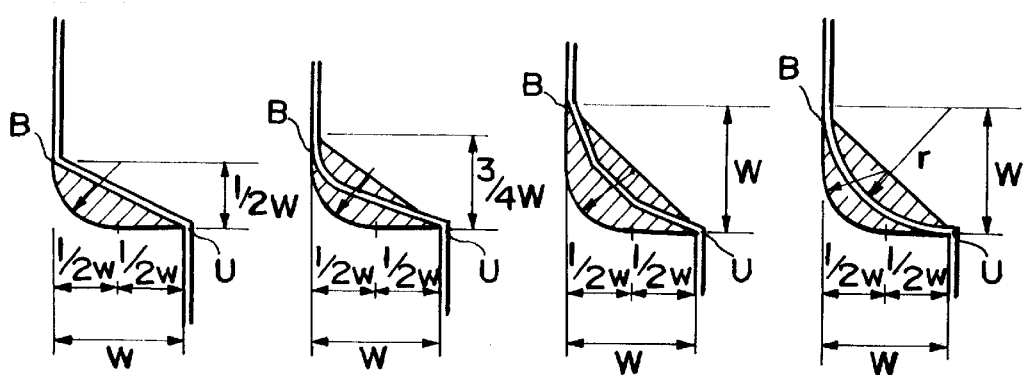

Further, the link portion substantially exists in an area (a hatched area in FIG. 10, hereinafter referred to as "location area") which is surrounded by a first line segment connecting the lower end B of the upper portion and the upper end U of the lower portion, a second line segment extending from the upper end portion of the lower portion to the inside of the reactor perpendicularly to the center axis by ½W, a quarter circular arc having a radius of curvature of ½W which is connected to the second line segment at one end thereof and extends to the lower end of the upper portion, and a third line segment connecting the other end of the circular arc and the lower end of the upper portion, and also the link portion is designed in a convex shape so as to project to the inside of the reactor.

FIG. 10A is a diagram showing a hatched area in which the link portion 19 of the present invention exists. FIGS. 10B to 10E shows specific examples of the link portion.

If the shape of the link portion is deviated from the above condition, a low-pressure area occurs in any case, resulting in occurrence of turbulence flow.

If the link portion is displaced to the lower side of the circular arc portion and to the lower side of the second line segment extending inwardly from the upper end of the lower portion, the flow of the gas discharged from the rotator is disturbed due to the relationship with H as described later, and this is unfavorable. It has been confirmed that even when the link portion is slightly displaced from the location area in the neighborhood of the lower end of the upper portion or the upper end of the lower portion, at least the effect of the present invention could be achieved if in any case the displacement amount of the link portion from the location area is less than 5% of the length of the link portion and also a center portion corresponding to 90% of the overall link portion, except for both the ends of the link portion each of which corresponds to 5% of the overall link portion, is located within the location area. Accordingly, if the effect of the present invention is obtained, the link portion 19 is regarded as substantially existing within the location area.

Further, the substantial convex shape of the link portion means that most of the link portion containing at least the lower end of the upper portion is designed in a convex shape projecting to the inside of the reactor, and only a portion of the link portion which is in the neighborhood of the connection portion to the upper end of the lower portion may be designed in a concave shape in order to achieve a straightening effect.

In this case, only the concave portion may be displaced from the location area.

The upper surface of the rotational substrate holder 12 is disposed so that the surface of the wafer substrate 11 mounted on the holder 12 is located below the upper end U of the lower portion of the reactor and keeps a predetermined height difference H from the upper end U of the lower portion.

It is preferable that the height difference H is within 4% of the diameter ($D_s$) of the holder 12, that is, within $0.04D_s$.

When the upper surface of the wafer substrate 11 is located above the upper end U, the flow of gas discharged from the surface of the holder 12 is disturbed, and this is unfavorable.

Further, if the height difference H exceeds $0.04D_s$, the distance between the link portion and the outer peripheral portion of the holder 12 is relatively increased, and thus a low-pressure area is formed just below the link portion, so that counter flow to the gas flow discharged from the holder 12 occurs and this causes turbulent flow.

The lower limit of H is set to be larger than the thickness (T) of transition layer of the gas flow supplied to the upper portion of the rotational substrate holder 12, that is, a gas layer in which the gas flow of the raw-material gas, etc. supplied through the straightening vane 17 has a vector directing from the center of the wafer substrate 11 to the outer peripheral portion thereof on the rotational substrate holder 12 as indicated by an arrow in FIG. 1.

If the height difference H is smaller than the thickness T of the transition layer, the gas flow directing the center of the wafer substrate 11 on the rotational substrate holder 12 to the outer peripheral portion is disturbed by the lower end B of the upper portion 1 of the reactor, and the blow-up phenomenon of the gas along the inner wall of the reactor occurs to promote occurrence of gas eddy flow, so that a large amount of deposits Adhere to the link portion 19 and the inner wall of the lower portion 2 of the reactor.

In general reactors which have been hitherto used, the transition layer thickness T of the gas flow on the rotational substrate holder 12 is varied mainly in accordance with the kind of the environmental gas in the reactor, the pressure in the reactor and the rotational number of the rotational substrate holder, and it can be calculated by the following equation (1). The equation (1) is generally given by hydrodynamics:

$$T = 3.22(v/\omega)^{1/2} \qquad (1)$$

(here, $v$ represents the coefficient of dynamic viscosity (mm²/s) of the reaction gas in the reactor, $\omega$ represents the angular velocity (rad/s) of rotation).

In this case, $\omega$ represents the minimum value in the thin film forming process in the vapor deposition apparatus.

For example, when the raw-material gas is silane gas, the carrier gas is hydrogen gas and the rotational number of the rotational substrate holder is set to 500 to 2000 rpm (52 to 209 rad/s), the transition layer thickness T is equal to about 5 to 50 mm.

Accordingly, it is preferable that the rotational substrate holder is disposed so that the upper surface thereof is located below the lower end B of the small-diameter upper portion 1 of the reactor with a height difference H larger than the above value of T. Accordingly, the gas flow directing from the center on the wafer substrate to the outer periphery thereof is made smooth, any particle of thin film forming material does not adhere to the inner wall of the reactor, and a thin film formed wafer thus obtained has no crystal defect, so that a uniform thin film can be formed.

As described above, the vapor deposition apparatus of the present invention can be designed and manufactured in the same manner as the reactor comprising the hollow cylinder having the fixed diameter over the overall body thereof in the conventional vapor deposition apparatus except that the reactor is partitioned into the upper and lower portions to form a continuous hollow cylinder which is varied in diameter between the upper and lower portions, the upper and lower portions which are different in diameter being linked to each other by a predetermined link portion to make the insides of the upper and lower portions continuous.

Further, the vapor deposition method which is carried out by using the vapor deposition apparatus of the present invention can be also performed in the same manner.

In the vapor deposition apparatus of the present invention thus constructed, the inside of the reactor 10 is exhausted by an exhaust control device which is connected to the exhaust ports 15 to adjust the internal pressure of the reactor to 20 to 50 torr for the reaction gas such as raw-material gas, the carrier gas, etc.

In addition, the rotational substrate holder 12 is rotated by actuating the motor to drive the rotational shaft 13, and the wafer substrate 11 mounted on the rotational substrate holder 12 is rotated at the same time. At the same time, the wafer substrate 11 on the rotational substrate holder 12 is heated to about 900 to 1200° C. by the heater 14, for example.

At the same time, the reaction gas containing the raw-material gas and the carrier gas is supplied into the reactor 10 through the plural reaction gas supply ports 16 while controlling the flow rate thereof to a predetermined value.

For the gas flow supplied into the space area S from the plural reaction gas supply ports 16, the momentum and pressure distribution thereof are made uniform. Thereafter, the gas passes through the holes 17a of the straightening vane 17 so that the gas flow rate distribution of the gas in the reactor is made uniform, and then supplied onto the substrate to form a uniform thin film on the substrate by vapor deposition.

EMBODIMENTS

The present invention is not Limited to the following embodiments.

Embodiment 1, Comparative Examples 1 and 2

The reactor was designed as the hollow cylinder having the same construction as the reactor shown in FIG. 1, and there was used each vapor deposition apparatus having a reactor for treating 8-inch øwafer substrates, which was designed so that the inner diameter $D_1$ of the upper portion of the reactor, the inner diameter $D_2$ of the lower portion of the reactor and the diameter $D_s$ of the rotational substrate holder were set to values shown in the table 1, the height difference H between the lower end B of the upper portion and the upper surface of the rotational substrate holder 12 was set to values shown in the table 1, and the link portion 19 was designed in a circular arc shape shown in FIG. 10E (having radius of curvature and width shown in the table 1).

Figure 2:
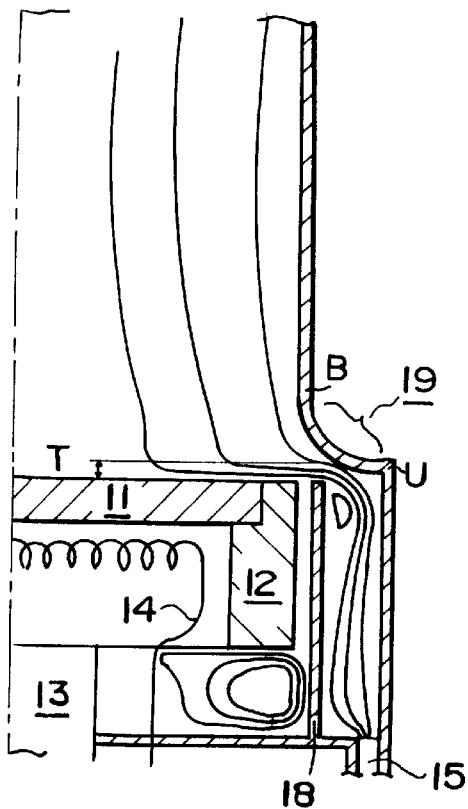
FIG. 2 is a gas streamline diagram showing an analysis result of gas flow in a reactor according to an embodiment 1 of the present invention.
Figure 3:
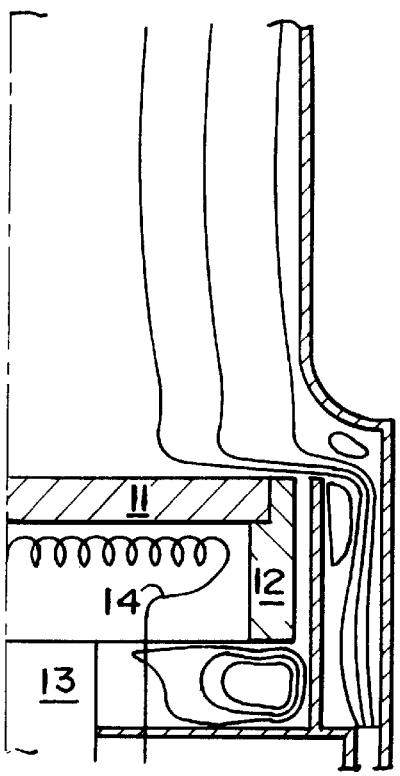
FIG. 3 is a gas streamline diagram showing an analysis result of gas flow in a reactor according to a comparative example 1 of the present invention.
Figure 4:
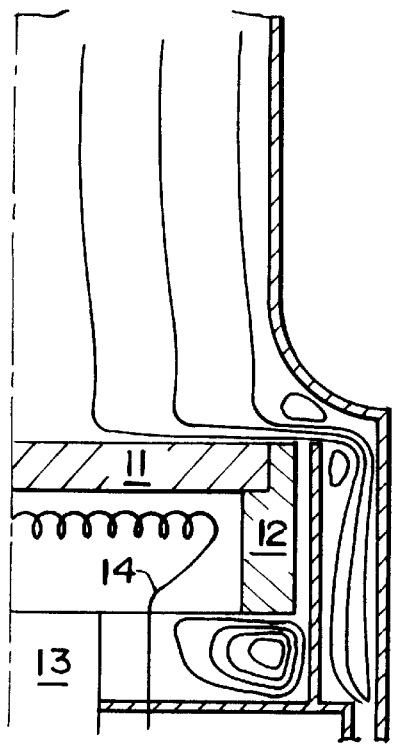
FIG. 4 is a gas streamline diagram showing an analysis result of gas flow in a reactor according to a comparative example 2 of the present invention.

By using each vapor deposition apparatus thus constructed, the gas flow state was analyzed according to the finite element method under the condition that the rotational number of the rotational substrate holder 12 was set to 2000 rpm and the flow rate of hydrogen carrier gas was set to 30 liter/minute (standard state) so that the internal pressure of the reactor was equal to 40 Torr. FIGS. 2 to 4 show the analysis results representing gas streamline diagrams in the radial direction of the reactor.

As is apparent from FIGS. 2 to 4, in the embodiment 1 (FIG. 2), the gas flow above the rotational substrate holder 12 is substantially made laminar flow, and no eddy flow occurs at the lower side of the link portion 19.

As compared with the embodiment 1, gas eddy flow occurs below the link portion in the case of the comparative example 1 (FIG. 3) in which the height difference H was set to a high value. Further, as compared with the embodiment 1, gas eddy flow also occurs below the link portion in the case of the comparative example 2 in which the diameter of the upper portion was set to a small value (FIG. 4).

Further, in the condition shown in the table 1, $SiH_4$ gas as the raw material gas and gas obtained by containing 0.1 ppm diborane ($B_2H_6$) as dopant in $H_2$ gas were supplied at 0.3 liter/minute and 0.01 liter/minute respectively together with hydrogen gas (carrier gas) supplied in the flow rate shown in the table 1 to form a $B_2H_6$-dopant silicon thin film on the 8-inch ø silicon wafer substrate mounted on the rotational substrate holder 12 by vapor deposition.

After the vapor deposition thin film was formed, the particle adhesion at the link portion and the inner peripheral wall of the lower portion of the reactor in the vapor deposition apparatus being used were visually observed, and the adhesion amount of the particles (large, small) is shown in the table 1.

The properties of the crystalline phase of the thin film formed wafer substrate surface were measured as the number of LPD (laser scatterer on wafer surface) of 0.135 micron or more by using Surfscan 6200 produced by Tencoal company, and the result is shown as number per wafer in the table 1. Further, the film thickness of the thin film thus formed was measured by an infrared-ray interference thicknessmeter to determine the maximum thickness ($F_{max}$) and the minimum thickness ($F_{min}$), and the uniformity of the thin film thickness was calculated according to $(F_{max}-F_{min})/(F_{max}+F_{min}) \times 100$. The result is show in the table 1.

Further, the resistance value of the thin film formed wafer substrate thus obtained was measured by using the C-V method, the maximum value ($R_{max}$) and the minimum value ($R_{min}$) of these values were determined, and the uniformity of the resistance values due to doping of dopant was calculated according to $(R_{max}-R_{min})/(R_{max}+R_{min}) \times 100$. The result is shown in the table 1.

From this result, it is apparent that the thin film formed on the wafer substrate by using the reactor of the embodiment 1 had uniform film thickness and uniform properties such as in-plane resistance, etc.

Comparative Examples 3 and 4

Figure 5:
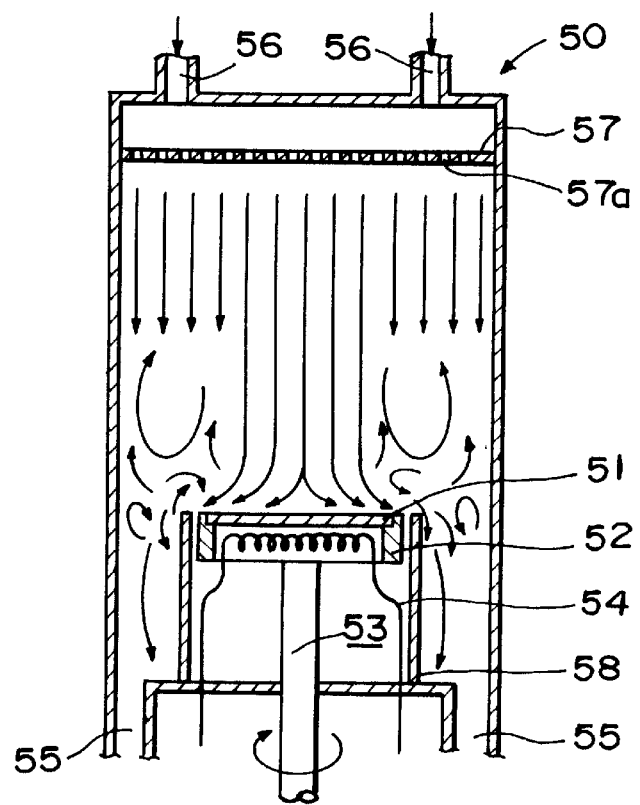
FIG. 5 is a longitudinally sectional view showing a reactor structure of a conventional high-speed rotational vapor deposition apparatus.
Figure 6:
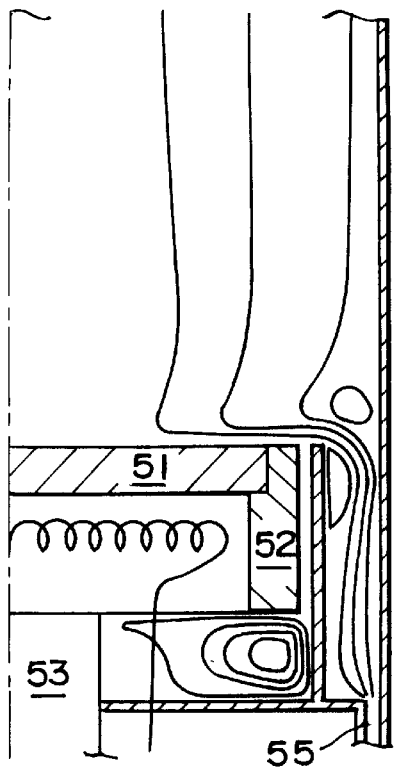
FIG. 6 is a gas streamline diagram showing an analysis result of gas flow according to a comparative example 3 using a conventional reactor.

Hydrogen gas as carrier gas was supplied in the same manner as the embodiment 1 by using the conventional reactor which was constructed substantially in the same manner as the apparatus shown in FIG. 5, and the gas flow state was analyzed in the same manner (comparative example 3). The analysis result is shown as a gas streamline diagram in the radial direction of the reactor in FIG. 6. In FIG. 6, the laminar flow state of the gas flow above the rotational substrate holder 52 is also disturbed, and large eddy flow occurs at the upper portion of the outside thereof.

Further, the gas flow state was analyzed in the same manner as the comparative example 3 except that the hydrogen gas flow rate was increased to 200 liter/minute in the reactor under the same condition (comparative example 4).

Figure 7:
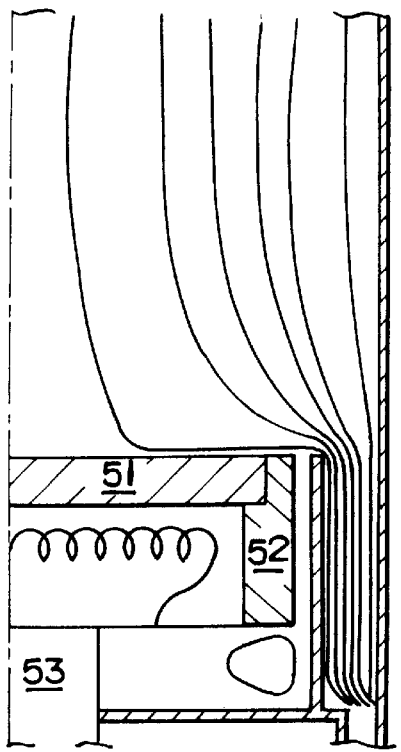
FIG. 7 is a gas streamline diagram showing an analysis result of gas flow according to a comparative example 4 using the conventional reactor in which the gas flow amount is increased.

The analysis result is shown as a gas streamline diagram in the radial direction of the reactor in FIG. 7.

In FIG. 7, the gas flow above the rotational substrate holder 52 is made laminar flow, and large eddy flow is extinguished at the upper portion of the outside thereof.

In the comparative examples 3 and 4, the thin films were formed by vapor deposition in the same manner as the embodiment 1, and the properties of the films were examined. The results are shown in the table 1.

Comparative Example 5

Figure 8:
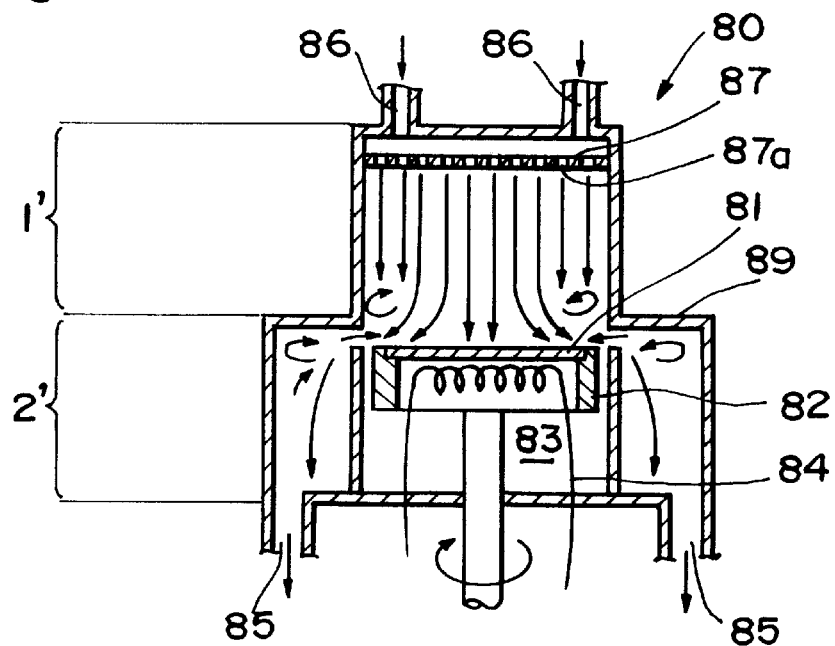
FIG. 8 is a longitudinally sectional view showing a conventional reactor structure having upper and lower portions which are different in inner diameter.

The gas flow analysis was made in the same manner as the embodiment 1 by using a reactor 80 of a vapor deposition apparatus which was designed so that the inner diameter of the upper portion was set to a small value to make different in diameter between the upper and lower portions of the reactor as shown in FIG. 8.

The reactor 80 of FIG. 8 is designed in the same construction as the reactor of the vapor deposition apparatus of the embodiment 1, except that the reactor 80 is partitioned into a small-diameter upper portion 1' and a large-diameter lower portion 2' which are different in diameter, and the lower end of the upper portion and the upper end of the lower portion are located on the substantially same horizontal plane with no height difference therebetween and connected to each other by a substantially horizontal planar link portion 89.

For the same members as those of the apparatus shown in FIG. 1, the numerical value of the units digit thereof is represented by the same numeral or the same symbol.

In the reactor 80, the inner diameter $D_1$ of the upper portion of the reactor, the inner diameter $D_2$ of the lower portion and the diameter Ds of the rotational substrate holder are shown in the table 1. Hydrogen gas is made to flow into the reactor 80 in the same manner as the embodiment 1 to analyze the gas flow state. The analysis result is shown as a gas streamline diagram in the radial direction of the reactor in FIG. 9.

Figure 9:
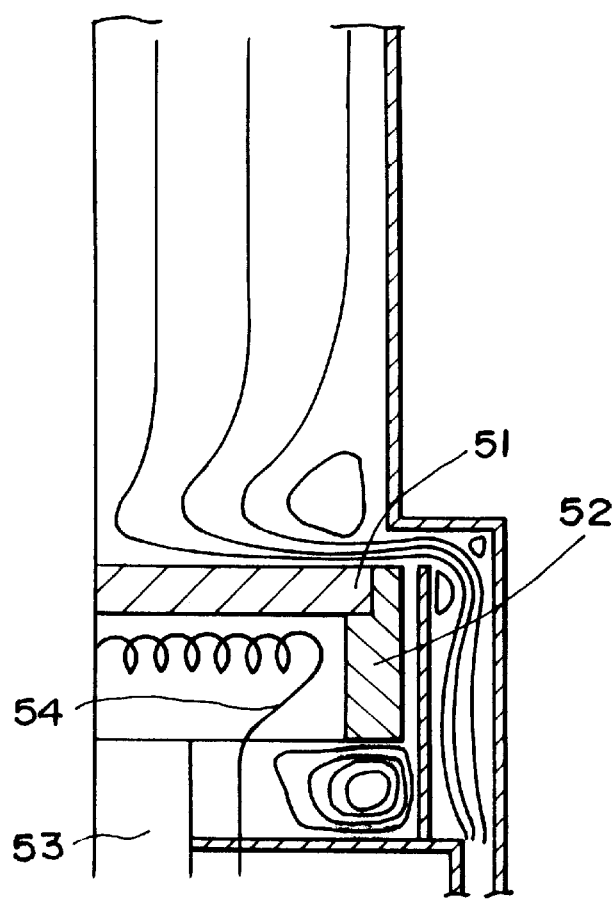
FIG. 9 is a gas streamline diagram showing an analysis result of gas flow according to a comparative example 5 using the conventional reactor.

In FIG. 9, the laminar state of the gas flow above the rotational substrate holder 52 is disturbed, and large eddy flow occurs at the upper portion of the outside thereof.

In the comparative example 5, the thin film was formed in the same manner as the embodiment 1 by vapor deposition, and the properties of the thin film was examined. The result is shown in the table 1.

As is apparent from the embodiment and the comparative examples, the inside of the reactor is partitioned into an upper portion and a lower portion which are different in diameter, and the lower end of the upper portion and the upper end of the lower portion are disposed so as to keep the height difference therebetween and connected to each other by the link portion, whereby the gas flow above the rotational substrate holder is made laminar flow without increasing the gas flow rate, that is, the gas flow amount.

Further, the eddy flow which occurs at the upper portion of the outside of the rotational substrate holder of the conventional reactor having the same diameter is suppressed, and the ratio in length between the upper and lower portions is set to a predetermined value to thereby extinguish the eddy flow.

Therefore, in the reactor of this embodiment of the present invention, the gas flow supplied from the straightening vane of the upper portion is not turbulent or disturbed, and flows down onto the rotational substrate holder with keeping its laminate flow state, thereby forming a thin film having a uniform film thickness and a uniform in-plane characteristic on the wafer substrate mounted on the rotational substrate holder.

According to the high-speed rotational vapor deposition apparatus of the present invention, the upper and lower portions of the reactor which are different in inner diameter are linked to each other by the link portion having the curved surface, whereby the reaction gas can be stably supplied as laminate flow onto the surface of the wafer substrate mounted on the rotational substrate holder, and it smoothly flows in the radial direction of the rotational substrate holder an flows out from the exhaust port without occurrence of disturbance such as eddy flow or the like at the outer peripheral surface side. Therefore, the smooth and uniform flow state with no disturbance of reaction gas can be achieved without increasing the gas flow amount and with a relatively small gas flow amount, and high precision within the inner-pressure controllable range, and the thin film having uniform film thickness and homogenous in-plane characteristics can be formed in low cost.

TABLES 1

|  |  | Emb. | Comp. Exam. | | | | |
|---|---|---|---|---|---|---|---|
|  |  | 1 | 1 | 2 | 3 | 4 | 5 |
| APPARATUS | $D_1$ (mm) | 260 | 260 | 237 | 337 | 337 | 237 |
| CONDITION | $D_2$ (mm) | 337 | 337 | 337 | 337 | 337 | 337 |
|  | $D_S$ (mm) | 260 | 260 | 260 | 260 | 260 | 260 |
|  | H (mm) | 5.0 | 25.5 | 5.0 | — | — | 5.0 |
|  | r (mm) | 38.5 | 38.5 | 50.0 | — | — | — |
|  | W (mm) | 38.5 | 38.5 | 50.0 | — | — | 38.5 |
| GAS FLOW | temperature (° C.) | 1000 | 1000 | 1000 | 1000 | 1000 | 1000 |
| RATE | pressure (torr) | 40 | 40 | 40 | 40 | 30 | 30 |

TABLES 1-continued

|  |  | Emb. | Comp. Exam. | | | | |
|---|---|---|---|---|---|---|---|
|  |  | 1 | 1 | 2 | 3 | 4 | 5 |
| CONDITION | Hydrogen gas flow rate (1/min) | 30 | 30 | 30 | 30 | 200 | 30 |
| RESULT | uniformity of film thickness | 0.85 | 1.03 | 3.26 | 8.71 | 0.98 | 24.98 |
|  | uniformity of resistance value | 4.30 | 5.61 | 6.39 | 31.15 | 8.33 | 41.16 |
|  | LPD(>0.135 μm) (number) | 88 | 561 | 10128 | 33707 | 1087 | 220589 |
|  | particle deposition at upper portion | small | large | large | — | — | large |
|  | particle deposition at link portion | small | small | small | large | large | small |
|  | particle deposition at lower portion | no | no | small | large | small | large |
|  | gas streamline diagram | FIG. 2 | FIG. 3 | FIG. 4 | FIG. 6 | FIG. 7 | FIG. 9 |

What is claimed is:

1. A high-speed rotational vapor deposition apparatus for forming a thin film, which includes plural reaction gas supply ports at the top portion of a hollow reactor, an exhaust port at the bottom portion of the reactor, a rotational substrate holder which is provided inside the reactor and on which a wafer substrate is mounted, and a straightening vane having plural gas holes formed at the upper portion of the inside thereof, thereby forming a thin film on the surface of a wafer substrate on the rotational substrate holder by supplying the reaction gas into the reactor, characterized in that the hollow inside of said reactor is partitioned into cylindrical upper and lower portions which have the same center axis and are different in equivalent inner diameter, the equivalent inner diameter of said upper portion being smaller than that of said lower portion, and the lower end of said upper portion and the upper end of said lower portion being linked to each other by a link portion to make continuous the hollow insides of said upper and lower portions of said reactor, and that the lower end of said link portion is disposed so as to be spaced from the surface of the wafer substrate mounted on said rotational substrate holder by a predetermined height difference, and wherein the following condition A is satisfied:

when W represents half of the difference between the inner diameter ($D_1$) of said upper portion and the inner diameter ($D_2$) of said lower portion on a section which is taken by a plane passing the center axis of the cylindrical portions of said upper and lower portions of the reactor, on any section, (1) the lower end of said upper portion is located at the upper side of the upper end of said lower portion by a height difference from ½W to W, and (2) said link portion substantially exists in an area surrounded by a first line segment connecting the lower end of said upper portion and the upper end of said lower portion, a second line segment extending from the upper end of said lower portion to the inside of said reactor perpendicularly to the center axis by ½W, a quarter circular arc which is connected to the second segment at one end thereof, directs to the lower end of said upper portion and has a radius of curvature of ½W, and a third line segment extending from the other end of the circular arc to the lower end of said upper portion, and said link portion is designed substantially in a convex shape which projects to the inside of said reactor.

2. The high-speed rotational vapor deposition apparatus as claimed in claim 1, wherein the horizontally sectional shape of the hollow inside of said reactor is circular and the rotational substrate holder has a circular section of an outer diameter ($D_s$), the inner diameter ($D_1$) of said upper portion of said reactor being set to 90 to 110% of the outer diameter ($D_s$), and wherein said link portion is designed so that the condition A is satisfied and that the height differences (H) between the upper end of said lower portion of said reactor and the surface of the wafer substrate mounted on said rotational substrate holder is within 4% of the outer diameter ($D_s$).

3. The high-speed rotational vapor deposition apparatus as claimed in claim 2, wherein the sectional shape in the condition A of said link portion is a convex shape connecting the lower end of said upper portion of said reactor and the upper end of said lower portion of said reactor.

4. The high-speed rotational vapor deposition apparatus as claimed in claim 3, wherein the sectional shape of said link portion is a quarter circular arc shape having a radius of curvature equal to W.

5. The high-speed rotational vapor deposition apparatus as claimed in claim 2, wherein the sectional shape of said link portion is a linear shape connecting the lower end of said upper portion and the upper end of said lower portion.

6. A high-speed rotational vapor deposition apparatus as method, characterized in that in said high-speed rotational vapor deposition apparatus as claimed in claim 1, the rotational speed of said rotational substrate holder is set to 500 rpm or more, and reaction gas containing thin film forming raw-material gas and carrier gas is supplied from said plural reaction gas supply ports and passed through said holes of said straightening vane to flow onto the wafer substrate.

* * * * *